(12) United States Patent
Sopori

(10) Patent No.: US 8,796,160 B2
(45) Date of Patent: Aug. 5, 2014

(54) OPTICAL CAVITY FURNACE FOR SEMICONDUCTOR WAFER PROCESSING

(75) Inventor: Bhushan L. Sopori, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 382 days.

(21) Appl. No.: 12/919,433

(22) PCT Filed: Mar. 12, 2009

(86) PCT No.: PCT/US2009/036896
§ 371 (c)(1),
(2), (4) Date: Aug. 25, 2010

(87) PCT Pub. No.: WO2009/148678
PCT Pub. Date: Dec. 10, 2009

(65) Prior Publication Data
US 2011/0003485 A1     Jan. 6, 2011

Related U.S. Application Data

(60) Provisional application No. 61/036,125, filed on Mar. 13, 2008.

(51) Int. Cl.
*H01L 21/26*     (2006.01)
*F27D 11/12*     (2006.01)

(52) U.S. Cl.
USPC ........................................................ 438/795

(58) Field of Classification Search
USPC ................................................. 438/974, 795
See application file for complete search history.

(56) References Cited

U.S. PATENT DOCUMENTS

| 4,755,654 A | 7/1988 | Crowley et al. |
| 4,789,771 A * | 12/1988 | Robinson et al. ............. 219/405 |

(Continued)

FOREIGN PATENT DOCUMENTS

| JP | 60037116 | 2/1985 |
| JP | 11351850 | 12/1999 |

(Continued)

OTHER PUBLICATIONS

Tsuo, Y.S., Pitts, J.R., High-flux solar furnace processing of silicon solar cells, Photovoltaic Energy Conversion, 1994, Conference Record of the Twenty Fourth; IEEE Photovoltaic Specialists Conference, 1994 IEEE First World Conference, vol. 2, Dec. 5-9, 1994 pp. 1307-1310.

(Continued)

*Primary Examiner* — Robert Carpenter
(74) *Attorney, Agent, or Firm* — John C. Stolpa

(57) ABSTRACT

An optical cavity furnace 10 having multiple optical energy sources 12 associated with an optical cavity 18 of the furnace. The multiple optical energy sources 12 may be lamps or other devices suitable for producing an appropriate level of optical energy. The optical cavity furnace 10 may also include one or more reflectors 14 and one or more walls 16 associated with the optical energy sources 12 such that the reflectors 14 and walls 16 define the optical cavity 18. The walls 16 may have any desired configuration or shape to enhance operation of the furnace as an optical cavity 18. The optical energy sources 12 may be positioned at any location with respect to the reflectors 14 and walls defining the optical cavity. The optical cavity furnace 10 may further include a semiconductor wafer transport system 22 for transporting one or more semiconductor wafers 20 through the optical cavity.

14 Claims, 5 Drawing Sheets

(56) References Cited

U.S. PATENT DOCUMENTS

| | | |
|---|---|---|
| 4,846,746 A | 7/1989 | Prost |
| 4,982,347 A | 1/1991 | Rackerby et al. |
| 5,304,509 A | 4/1994 | Sopori |
| 5,358,574 A | 10/1994 | Sopori |
| 5,410,162 A | 4/1995 | Tigelaar et al. |
| 5,426,061 A | 6/1995 | Sopori |
| 5,429,985 A | 7/1995 | Sopori |
| 5,446,825 A | 8/1995 | Moslehi et al. |
| 5,452,396 A | 9/1995 | Sopori |
| 5,577,157 A * | 11/1996 | Sopori ............ 392/416 |
| 5,614,020 A * | 3/1997 | Stevens et al. ........ 117/205 |
| 5,619,462 A | 4/1997 | McClure |
| 5,639,520 A | 6/1997 | Sopori |
| 5,693,889 A | 12/1997 | Nadolink |
| 5,897,331 A | 4/1999 | Sopori |
| 5,970,214 A | 10/1999 | Gat |
| 6,019,848 A | 2/2000 | Frankel et al. |
| 6,047,107 A | 4/2000 | Roozeboom et al. |
| 6,072,160 A | 6/2000 | Bahl |
| 6,201,261 B1 | 3/2001 | Sopori |
| 6,210,484 B1 | 4/2001 | Hathaway |
| 6,232,580 B1 | 5/2001 | Sandhu |
| 6,258,524 B1 | 7/2001 | Hirabayashi |
| 6,604,853 B2 | 8/2003 | Chao et al. |
| 6,798,503 B2 | 9/2004 | Hiramoto et al. |
| 6,803,588 B2 | 10/2004 | Kamieniecki |
| 6,807,454 B2 | 10/2004 | Wang et al. |
| 6,816,251 B2 | 11/2004 | Swan et al. |
| 6,840,841 B2 | 1/2005 | Hakomori |
| 6,852,371 B2 | 2/2005 | Sopori |
| 6,861,268 B2 | 3/2005 | Iwabuchi |
| 7,238,912 B2 | 7/2007 | Sopori |
| 7,773,211 B2 | 8/2010 | Borden |
| 7,828,893 B2 | 11/2010 | Mueller et al. |
| 8,006,556 B2 | 8/2011 | Sheynblat |
| 8,006,566 B2 | 8/2011 | Sopori et al. |
| 2002/0005400 A1 | 1/2002 | Gat |
| 2003/0068903 A1 * | 4/2003 | Suzuki et al. ............ 438/799 |
| 2005/0008218 A1 | 1/2005 | O'Dell et al. |
| 2005/0264798 A1 | 12/2005 | Nishiyama et al. |
| 2005/0282299 A1 | 12/2005 | Kim et al. |
| 2006/0037941 A1 | 2/2006 | Weng et al. |
| 2006/0186354 A1 | 8/2006 | Kawase et al. |
| 2007/0235769 A1 | 10/2007 | LaRosa et al. |
| 2011/0073869 A1 | 3/2011 | Bounassi et al. |

FOREIGN PATENT DOCUMENTS

| | | |
|---|---|---|
| WO | 2008013547 | 1/2008 |
| WO | 2009148678 | 12/2009 |

OTHER PUBLICATIONS

Written Opinion and International Search Report dated Jan. 7, 2010, for International Application No. PCT/US09/36986.

Sopori, B., et al., A High Throughput, Noncontact System for Screening Silicon Wafers Predisposed to Breakage during Solar Cell Production, Abstract, 37th IEEE Photovoltaic Specialists Conf., Feb. 21, 2011.

International Search Report & Written Opinion, dated May 19, 2011, for International Application No. PCT/US11/24584.

Mier, Graphics Script Provides Quick Classification of GaAs Wafers, Reed Electronics, Apr. 1, 2000, Reed Elsevier Inc.

Higgs, Non-Destructive Optical Methods for Assessing Defects in Production of Si or SiGe Materials, The European Physical Journal, Feb. 10, 2004, 43-48, vol. 27.

International Search Report, dated Jul. 28, 2008, for International Application PCT/06/29765.

* cited by examiner

OPTICAL CAVITY FURNACE FOR SEMICONDUCTOR WAFER PROCESSING

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Semiconductor wafer fabrication involves many high-temperature steps such as phosphorus diffusion, aluminum alloying, the deposition of coatings, hydrogen passivation, front contact formation and other processes. Currently, semiconductor wafers are typically processed either in a conventional electric thermal furnace or in an infrared (IR) furnace. Electric ovens or furnaces are often expensive and slow to use and may result in distortion of a semiconductor wafer. Impurity redistribution may also occur with a conventional processing oven, since impurities may permeate the wafer from or through the hot walls of the furnace or oven.

Rapid thermal annealers are known which utilize an optical energy source to quickly raise the temperature of a semiconductor wafer. Such annealers, however, while increasing the speed of heating, may also increase non-uniform heating of the wafer being processed. Conventional optically assisted rapid thermal annealers typically produce non-uniform light energy profiles over a wafer which may create heat stress in the wafer leading to possible breakage and undesirable residual electrical characteristics. For example, uneven heating or other process variations may result in non-uniform electrical activation, defects or wafer distortion. In addition, a uniform optical flux, if it can be achieved over a wafer, will typically result in uneven wafer heating because of differing amounts of radiative heat loss across the various regions of a wafer surface.

Improved optical processing furnaces are known which utilize photonic effects to enhance thermal reactions. Known optical furnaces are, however, generally single-batch laboratory furnaces which are not suitable for high throughput or continuous operation such as is desirable in a commercial furnace. Furthermore, known optical laboratory furnaces which are designed to process single or small batches of wafers, may be operated effectively with a much higher optical energy loss rate and therefore less efficiency than is desirable in a commercial production furnace.

The embodiments disclosed herein are intended to overcome one or more of the problems discussed above. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment disclosed herein is an optical cavity furnace having multiple optical energy sources associated with an optical cavity. The multiple optical energy sources may be lamps or other devices suitable for producing an appropriate level of optical energy. The optical cavity furnace may also include one or more reflectors and one or more walls associated with the optical energy sources such that the reflectors and walls define the optical cavity. The walls may have any desired configuration or shape to enhance operation of the furnace as an optical cavity. The optical energy sources may be positioned at any location with respect to the reflectors and walls defining the optical cavity. For example, energy sources may be positioned in the top, side or bottom walls. The energy sources may be positioned to achieve desired flux levels at various locations within the optical cavity. For example, selected optical energy sources may be placed closer to a wafer edge to compensate for possible wafer edge cooling effects.

The reflectors may be fabricated as structures within or on the walls. In addition, the optical energy sources may be oriented transverse to, parallel with, at an angle with respect to the optical cavity of the furnace or in any combination of orientations. The optical energy sources will thus be located as desired anywhere in association with the optical cavity. The optical cavity furnace may further include a semiconductor wafer transport system for transporting one or more semiconductor wafers through the optical cavity. The semiconductor conductor wafer transport system may be any suitable type of transport system, including but not limited to, a mechanical carriage, a motorized transport or a conveyor belt system.

The reflectors and walls defining the optical cavity may have a diffusely reflective surface. A diffusely reflective optical cavity surface is advantageous to ensure that optical energy is efficiently and evenly reflected within the cavity with a minimum of optical energy loss. The optical cavity furnace may also include a transmissive muffle located within the optical cavity between the transport system and the diffusely reflective surfaces.

Various process parameters associated with the optical cavity furnace may be independently controlled. For example, a flux controller may be provided which controls the power input to each optical energy source which, along with selected energy source placement, may achieve a select flux distribution along a selected dimension or through a selected area of the optical cavity furnace. The flux distribution may be variable or fully adjustable. A transport rate controller may be provided which controls the rate at which semiconductor wafers are transported through the optical cavity furnace. Similarly, a process substance controller may be provided which controls the introduction or withdrawal of process substances such as process gases which may be introduced into the optical cavity through specific inlets or outlets. The process substance outlets may be located below or otherwise away from the plane of the transport system to minimize the interaction of process substances with the optical energy sources.

Another embodiment is a method of processing a semiconductor wafer which includes transporting a semiconductor wafer through an optical cavity furnace as described above. The method may include subjecting the wafer to flux from the optical energy sources. The flux may be provided according to a selected or controlled flux profile. Similarly, the rate at which the semiconductor wafer is transported through the optical cavity furnace, or the addition or extraction of process substances, may also be controlled.

In addition to the exemplary aspects and embodiments described above, further aspects and embodiments will become apparent by reference to the drawings and by studying of the following descriptions.

BRIEF DESCRIPTION OF THE DRAWINGS

Exemplary embodiments are illustrated in referenced figures of the drawings. It is intended that the embodiments and figures disclosed are to be considered to be illustrative rather than limiting.

DESCRIPTION

Figure 1:
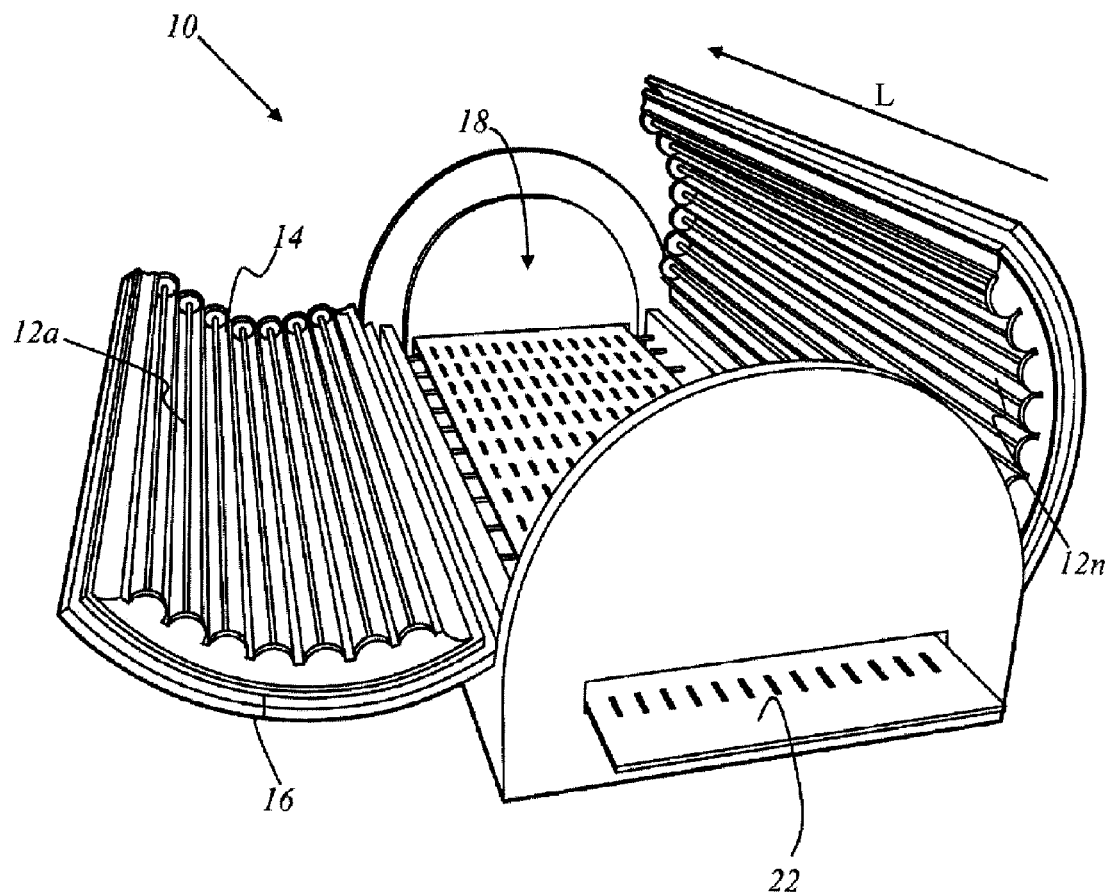
FIG. 1 is a perspective view of an optical cavity furnace.

FIG. 1 shows by way of non-limiting example one embodiment of an optical cavity furnace 10. The optical cavity furnace 10 includes multiple sources of optical energy 12a-n distributed along a length L. Although the optical energy sources 12 are illustrated in FIG. 1 as lamps positioned parallel to the length L at the top and sides of an optical cavity furnace 10, it should be noted that this configuration is not typical or limiting. On the contrary, as described in detail below, various embodiments will feature the optical energy sources 12 distributed on the top, sides and bottom of the optical cavity furnace to achieve specific flux goals.

To the extent lamps having a generally elongate cylindrical shape are used, the lamps may be positioned perpendicular to the length L, parallel to the length L, or at select angles with respect to the length L. The optical cavity furnace 10 is not limited to any specific number or type of optical energy sources 12. Any suitable number and orientation of optical energy sources 12 may be selected to achieve specific semiconductor fabrication goals as disclosed herein.

The optical energy sources may be selected from any type of apparatus which produces energy having desirable intensity, wavelength or other optical characteristics. For example, the optical energy sources 12 may be multiple tungsten halogen lamps disposed along the length L of the optical cavity furnace 10. The optical energy sources 12 may have a non-planar aperture. A mixed variety of types of lamps or optical sources may be used to achieve selected fabrication goals.

As illustrated in FIG. 1, each optical energy source 12a-n may be associated with one or more corresponding reflectors 14. The reflectors may be positioned within the top, side, or bottom walls of an optical cavity furnace 10. Although the reflectors 14 of FIG. 1 correspond to lamps which are located at the top and sides of an optical cavity furnace 10 and positioned parallel to the length L, it is important to note that this configuration is not typical or limiting. Furthermore, the reflectors 14 and corresponding lamps may be positioned parallel to, transverse, or at a selected angle with respect to the length L of the optical cavity furnace 10. In many cases, the reflectors 14 will be fabricated into or onto the walls of the optical cavity furnace. The reflectors 14 may have any type of reflective surface; however, as described herein, certain advantages may be recognized if the reflectors have a diffusely reflective surface rather than a specular reflective surface.

One or more walls 16 may also be associated with the sources of optical energy 12 such that the walls 16 and reflectors 14 together define an optical cavity 18. An optical cavity 18 as used herein is an illuminated space where optical energy may be applied by reflection from or between multiple reflective surfaces or by direct radiation.

Figure 2:
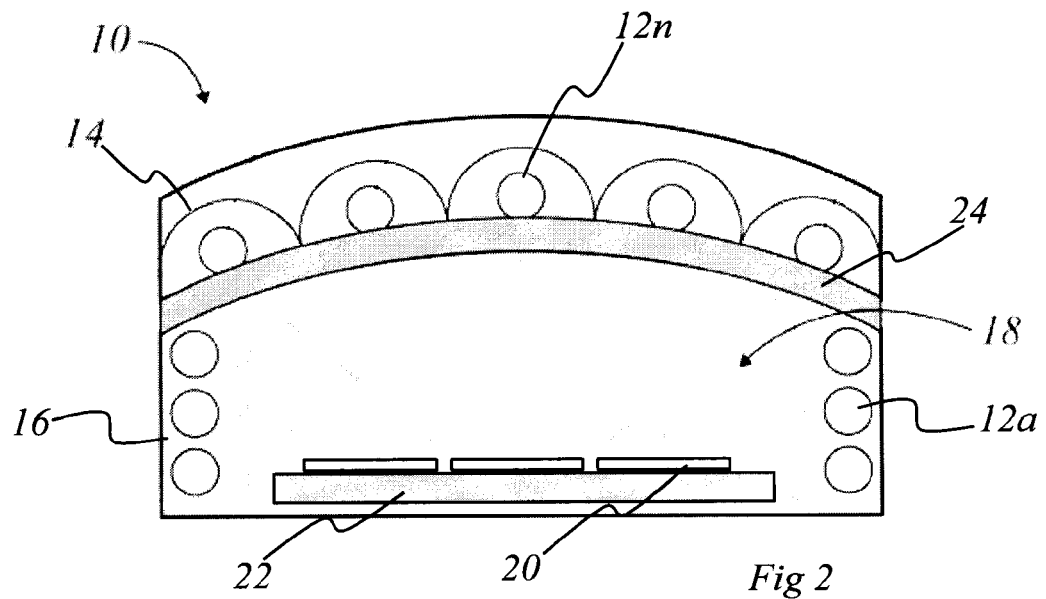
FIG. 2 is a cross-sectional view of the optical cavity furnace of FIG. 1.

The walls 16 of the optical cavity furnace 10 embodiment of FIG. 1 are hinged and may be opened to provide access to the cavity 18. FIG. 1 illustrates the optical cavity furnace 10 with the walls open. FIG. 2 illustrates the optical cavity furnace 10 with the walls closed in an operational state. The walls 16 may be configured or shaped to achieve specific flux conditions within the furnace. For example, the walls may be oriented to provide for multiple diffuse reflections of the optical energy with respect to anticipated semiconductor wafer locations. The reflectors 14 and diffusely reflecting walls 16 of the optical cavity 18 facilitate specifically tailored flux characteristics at any selected position along the length L of the optical cavity furnace 10. As described in detail below, the flux distribution at various positions along the length L may be manipulated and controlled in various fashions. The reflectors 14 and walls 16 of the optical cavity furnace 10 may be made of any diffusely reflecting high temperature material. For example, the reflectors 14 and walls 16 of an optical cavity furnace 10 may be made from a high temperature ceramic material such as Zircar. Other similar materials would be equally suitable for the construction of an optical cavity furnace 10.

Figure 3:
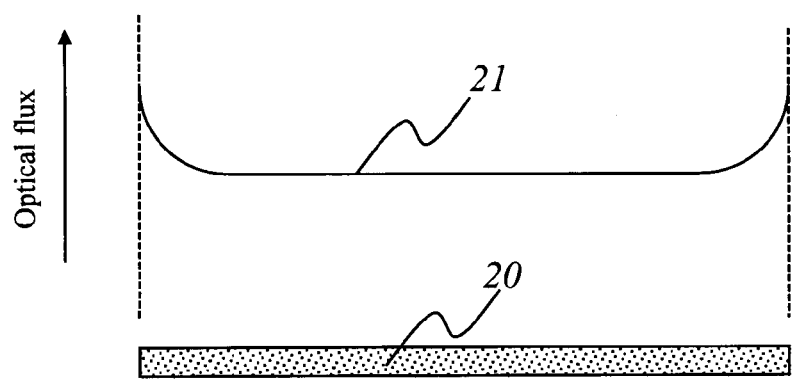
FIG. 3 is a graphic representation of an optical flux profile selected to uniformly heat a wafer.

Attaining a uniform temperature over a silicon wafer or over a series of wafers inside an optical cavity furnace 10 can be quite difficult because, in the presence of a near perfectly uniform optical flux, a wafer will have slightly lower temperature at the edges. The observed lower edge temperature exists because wafer cooling occurs primarily through radiation loss, and convection caused by the flow of process gas or gasses. Because radiation emanating from wafer edges is relatively higher than seen over the rest of the wafer, wafer edges are typically cooler than the rest of the wafer under a uniform flux. Accordingly, as graphically illustrated in FIG. 3, one approach to achieving a laterally uniform temperature profile over a wafer 20 is to increase the optical flux (graphically illustrated by flux profile 21) at the edges of the wafer. FIG. 2 illustrates that one method of accomplishing this goal is to position optical energy sources (12a for example) closer to the wafer near the edges thus increasing the flux density at the edges. This arrangement is also useful for a smaller laboratory furnace designed to heat one wafer at a time, where increased flux can be applied both in X and Y directions.

FIG. 2 is a schematic cross-section view of an optical cavity furnace 10 similar to that of FIG. 1 taken perpendicular to the length L. The view of FIG. 2 illustrates the concept of an optical cavity 18 where the position of optical energy sources 12 is selected to minimize edge losses. In particular, optical energy source 12a corresponding to an outside wafer edge can be positioned closer to the wafer surface than optical energy source 12n which corresponds to an interior or center wafer. In addition, light from the multiple optical energy sources 12 diffusely reflects from reflectors 14 and walls 16 to illuminate a representative semiconductor wafer 20 with both direct diffused and diffusely reflected light resulting in a specifically selected flux at the surface of the wafer 20.

Although not illustrated in FIG. 2, the optical energy sources 12 may additionally be associated with front, end or bottom walls of the optical cavity furnace 10. In addition, it is not necessary that the lamps be oriented in a uniform direction. As described in detail below, the position of the optical energy sources 12 and the orientation of these sources may be selected to ensure any desirable flux characteristics within the optical cavity 18. A furnace featuring an optical cavity 18 as described herein can be substantially more efficient than known optical furnaces, since nearly all light is confined within the furnace with minimal optical power loss.

The optical cavity furnace 10 may also include a system for transporting a semiconductor wafer 20 or a series or batch of wafers along the length L of the optical cavity 18. Various types of belts, trays, rollers, mechanized carriages or other apparatus may be used to transport one or more semiconductor wafers 20 along a dimension, for example the length L of the optical cavity furnace 10. By way of non-limiting example, a conveyor belt 22 is shown as a representative transport system in FIG. 1. The conveyor belt 22 may be made of a suitable material such as quartz, graphite mesh or other material which is selected to withstand the high temperature and intense optical energy present within the optical cavity 18. The conveyor belt 22 may include one or more separate structures designed to hold and support wafers 20 above the surface of the belt 22 or other transport system. By holding the wafers above the belt or transport system, appropriate heating of the underside of wafers may be achieved. This is particularly important in instances where the optical cavity furnace 10 includes sources of optical energy positioned on the lower sides and bottom walls 16.

Figure 4:
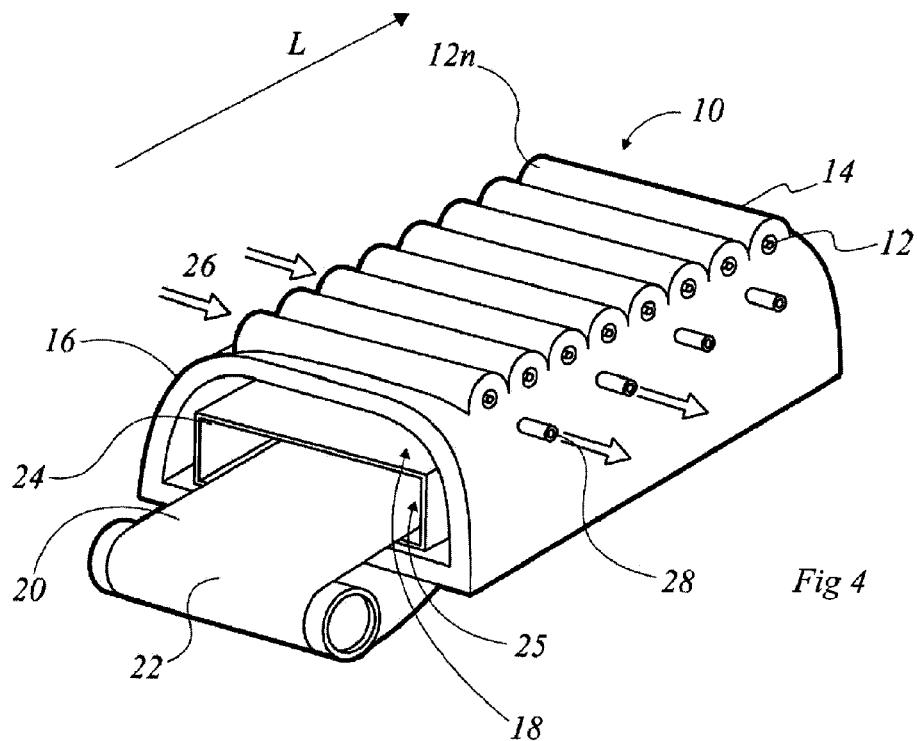
FIG. 4 is a perspective view of an alternative optical cavity furnace.

As shown in FIGS. 2 and 4, the optical cavity furnace 10 may also include a transmissive muffle 24 positioned between the belt 22 or other wafer transport system and the diffusely reflective surfaces of the walls 16 and reflectors 14 which define the optical cavity 18. The transmissive muffle 24 is able to transmit light, and therefore optical energy through the muffle to the semiconductor wafers. The muffle may be composed of quartz or another transmissive material with suitable high temperature characteristics. The transmissive muffle 24 serves to further diffuse, moderate and control the intensity of the optical flux provided to the semiconductor wafers 20. Accordingly, the muffle, if desired, may be fitted with a sensor and feedback mechanism to provide for the monitoring and control of the optical energy incident on a semiconductor wafer 20. The transmissive muffle 24 also may serve to define a process chamber 25 smaller in volume than the entire optical cavity 18. The smaller process chamber 25 may be useful for efficiently performing gas process steps as described below.

As is also shown on FIG. 4, the transmissive muffle 24 and/or the optical cavity furnace 10 may be fitted with one or more appropriate inlet 26 and outlet 28 openings which allow for the flowing of various substances through the process chamber 25, such as gases required for semiconductor device processing. A transmissive muffle 24 which defines a process chamber 25 may be used to ensure that process gasses or other process substances are applied and removed from the process chamber near, or as described below, from below the plane of the wafers. The gases or other substances flowed through the optical cavity furnace 10 may include but are not limited to, gases selected to control temperature such as argon or other inert gases used for cooling purposes. Alternatively, the gases may be directly involved in various processing steps well-known to those skilled in the semiconductor fabrication arts such as phosphorus diffusion, hydrogen passivation, or the deposition of coatings.

Multiple inlets 26 and outlets 28 may be distributed along a dimension such as the length L of the optical cavity furnace 10 to provide for the flowing of various substances into the furnace 10 or process chamber 25 as needed during various processing steps. In addition, it is important to note that there are situations in semiconductor processing where the evolution of effluent vapors may occur. For example, when alloying contacts formed by a screened printing process there may be an evolution of vapors in the initial phase of the heating process. These or other vapors can interfere with the proper completion of fabrication steps if not exhausted properly. In certain instances, it may be desirable to locate the outlet or exhaust vents near the bottom of the optical cavity 18, muffle 24 or otherwise locate the outlets away from the optical energy sources 12. For example, the exhaust outlets may be located below a plane defined by the wafer transport system if the optical energy sources are primarily positioned near the top of the optical cavity. A configuration where the exhaust vents are positioned away from the optical energy sources allows vapors to be removed without risking the possible interference with or overheating of the vapors by the optical energy sources. Similarly, gases needed for processing such as Ar, $N_2$ and $O_2$ as well as gases required to cool the optical energy sources, for example, $N_2$, may be fed into the optical cavity or muffle 24 from either end, or along the sides of the optical cavity. Cooling gases in particular may be injected from nozzles placed behind the optical energy sources to best facilitate cooling of these elements.

As described above, the optical energy sources 12 may be distributed along a dimension, for example, the length L of the optical cavity furnace 10 and in any desirable orientation or configuration with respect to the sides, top or bottom of the optical cavity furnace 10. The power input to any selected lamp or other energy source may be independently selected or controllable. Thus, the flux intensity and flux distribution at a location in the furnace may be controlled, for example by a process computer, and differ as needed along length L to achieve selected processing goals. The width and overall size of the optical cavity furnace 10 may be adjusted or selected to accommodate desired throughput rates.

One of the advantages of the optical cavity design disclosed herein is that it may be easily scaled without affecting the achievable flux profile. The length L of the furnace and the rate or rates at which wafers are transported through the furnace are both related to the residence time of the wafers within various flux zones maintained within the furnace as described herein.

The various embodiments of optical cavity furnaces described herein are well suited to high throughput or continuous processing of semiconductor wafers as is desirable for commercial operation. In use, a supply of semiconductor wafers 20 are transported through the optical cavity furnace 10 on a suitable apparatus, for example, the conveyor belt system 22 of FIG. 1. Thus, semiconductor wafers 20 are transported from one end of the optical cavity furnace 10 to the opposite end along length L. Several processing steps may be completed in series or in parallel as a wafer 20 is transported through the furnace, thus reducing total wafer fabrication cost. Because optical processing uses photonic effects and because several process steps can be combined, the energy consumption of an optical cavity furnace 10 as described herein can be significantly lower than the energy consumption of a conventional thermal furnace. The various embodiments of the optical cavity furnace 10 described herein also provide for a great deal of control over processing steps.

For example, several processing variables may be actively controlled to achieve selected processing results as semiconductor wafers 20 are transported through the furnace. These variables include, but are not limited to, the rate at which the transport system moves wafers through the furnace, which may be a variable rate, the selective and variable introduction of substances such as process gasses into the process chamber 25, and the power applied to selected optical energy sources 12. These and other controllable variables may be controlled manually or controlled by an automated system, for example, through the use of a suitable computer having flux control, process substance control, transport speed control or other control functionality. Each variable may be controlled independently, although certain processing variables may be manipulated in conjunction to achieve desired results. The total flux presented at a surface of a wafer over a select period of time is a function of both the optical power applied to the optical energy sources 12 in the vicinity of the wafer the relative location of those sources and the rate of wafer transport through the relevant flux zone. Any of these variables may be controlled to achieve a specific flux profile, while maintaining a uniform temperature across a series of wafers or across different regions of a select wafer. Similarly, the effect of various substances injected into the process chamber 25, various process gases for example, is a function of the nature of the process gas injected and withdrawn from the process chamber 25, temperature and photonic effects which may be controlled by the optical power controller and the rate at which wafers are transported through the furnace. Each of these and other variables may be independently controlled to achieve efficient overall wafer processing.

With optical processing, it is possible with computer analysis to predict the thermal stresses and possible defect generation on a wafer 20 as generated by a given flux profile. Thus, the risk of defective wafer processing and waste may be minimized. When using an optical cavity furnace 10 as described herein, it is important to note that the thermal effects and stresses on any selected wafer 20 will be affected by the wafer's position on the conveyor belt 22 or other wafer transport system. For example, all wafers will tend to radiate heat from their edges more than from their centers. Wafers towards the center of the conveyor belt 22 may be placed such that their adjacent edges are quite close to each other. Thus, the effects of edge radiation will be moderated by proximity to the edge of an adjacent wafer. Thus, thermal stress between the edge and center of a select wafer 20 may be minimized. On the contrary, wafers on the outer edges of the belt 22 will experience more dramatic edge cooling. As described above, the distribution of optical energy sources 12 may be selected to produce desired flux profiles. For example, additional energy sources may be placed in the side walls to compensate for radiation from the outside edge of the outside group of wafers 20.

The various embodiments of an optical cavity-type optical furnace as described herein may be used for many semiconductor wafer processing steps. The disclosed furnace embodiments may be used, for example, for N/P junction formation, aluminum alloying for back surface field preparation, contact formation, gettering, front contact formation, hydrogen passivation, phosphorus diffusion, and many other processing steps.

The use of optical processing may increase the overall speed of each processing step and thus further reduce power consumption. Optical processing provides efficient gettering of impurities (both dissolved and precipitated impurities). Hence, semiconductor wafers such as solar cells which are negatively impacted by impurities may be expected to have higher efficiency if produced by optical processing.

An alternative embodiment disclosed herein is a method of processing a semiconductor wafer. The method includes transporting a wafer 20 through an optical cavity furnace 10 as described above. While the wafer is transported through the optical cavity furnace 10, it is subjected to an optical flux profile which may be a variable flux profile. In addition, various substances such as processing gases may be applied to the semiconductor wafer 20 as it is transported through selected flux zones. The rate or speed at which one or more semiconductor wafers 20 are transported through the optical cavity furnace 10 may be variable or controlled. A transmissive muffle 24 may be employed within the optical cavity furnace 10 and located between the semiconductor wafer 20 and the sources of optical energy 12 to manage temperature or heat build-up, define a process chamber and ensure an even flux profile at a given location within the optical cavity furnace 10.

Figure 5:
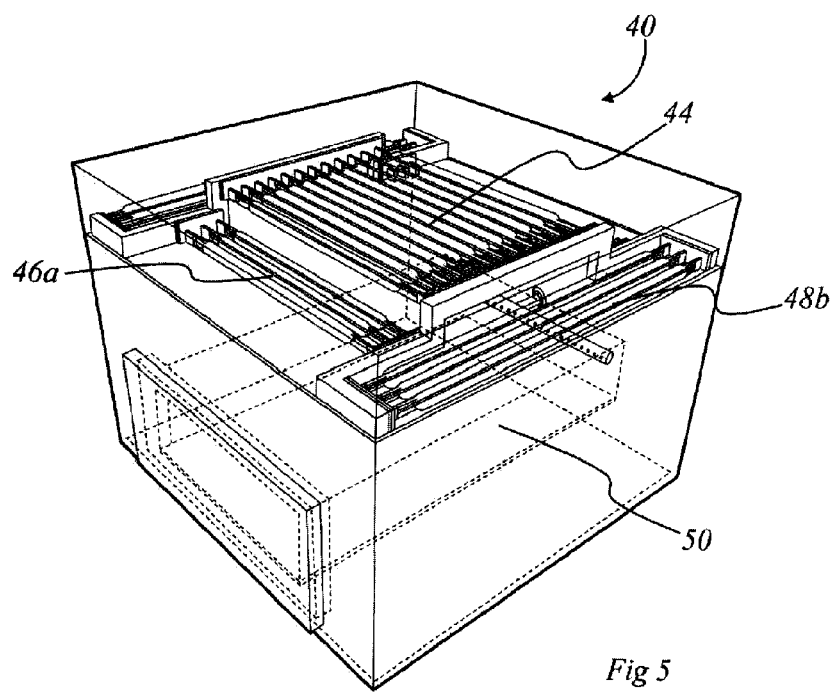
FIG. 5 is a perspective view of an alternative optical cavity furnace.
Figure 6:
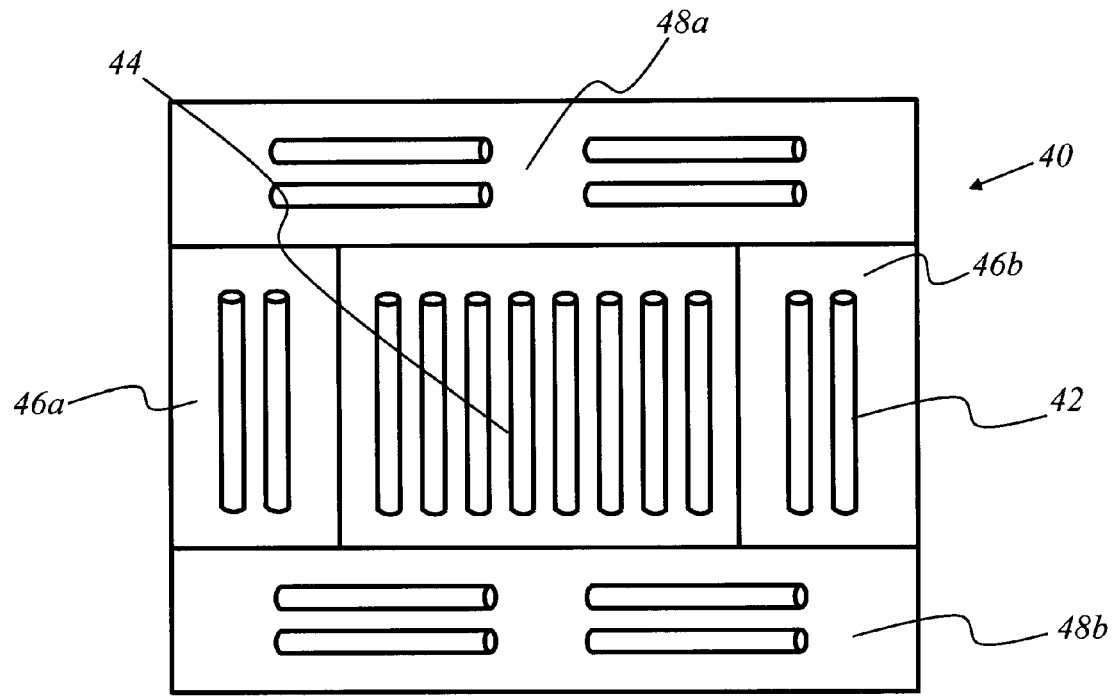
FIG. 6 is a schematic top plan view of the optical cavity furnace of FIG. 5.
Figure 7:
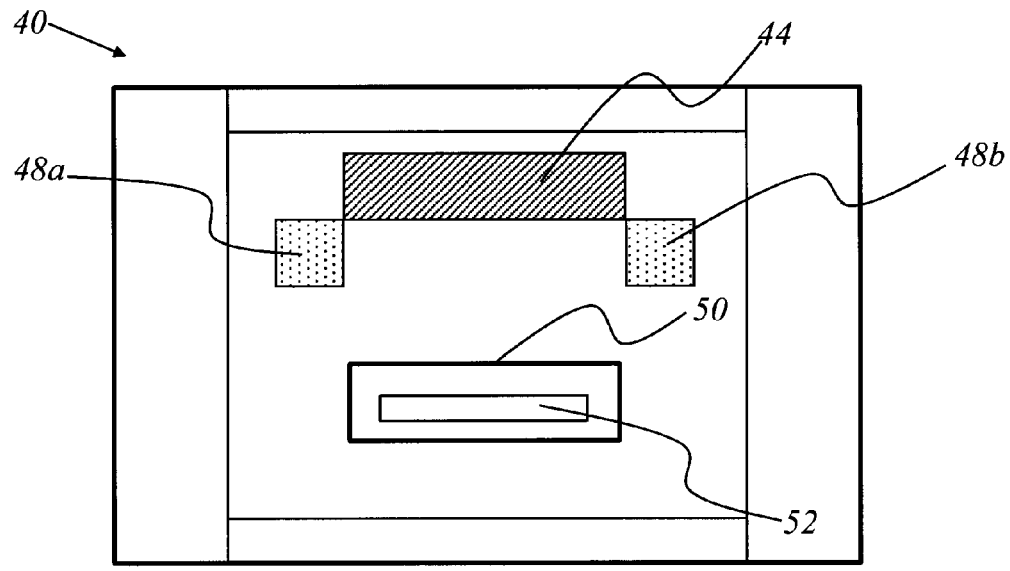
FIG. 7 is a schematic front sectional view of the optical cavity furnace of FIG. 5.

The embodiments of optical cavity furnace 10 described in detail above are well suited for use with continuous or relatively large batch production of semiconductor wafers. The concepts described herein can also be applied to smaller single wafer or small batch ovens such as would be typically used in a research setting. FIGS. 5-7 illustrate one possible configuration of a smaller research type optical cavity furnace 40. One distinction between the research optical cavity furnace 40 and the production optical cavity furnace 10 of FIG. 1 is that a transport mechanism such as the conveyor belt 22 may be unnecessary for small batch or single wafer processing. It is still important in a small batch or single wafer optical cavity furnace 40 that the flux profile over a wafer be controllable. Accordingly, as is shown in FIGS. 5-7 the optical energy sources 42 may be arranged in distinct zones which may be independently controlled. For example, the embodiment of FIGS. 5-7 includes a central zone 44, front and rear zones 46a and 46b, and side zones 48a and 48b. As is best illustrated in FIG. 7, the overall placement of these zones may be selected to achieve desired optical flux profile characteristics. For example, side zones 48a and 48b may be relatively closer to a muffle 50 and wafer 52 contained therein to increase flux density over an edge of the wafer 52. In addition, the power level and duration of power applied to optical energy sources 42 may be controlled by zone, or by independent optical energy source.

As is illustrated in FIG. 5, a single wafer small batch optical cavity furnace 40 may also include a gas inlet or gas outlet to provide and extract necessary process gases.

EXAMPLE

The following example is provided for illustrative purposes only and is not intended to limit the scope of any of the several embodiments disclosed herein. An optical cavity furnace 10 or 40 can be used for numerous processing steps not described in a detailed example herein.

Example 1

Figure 8:
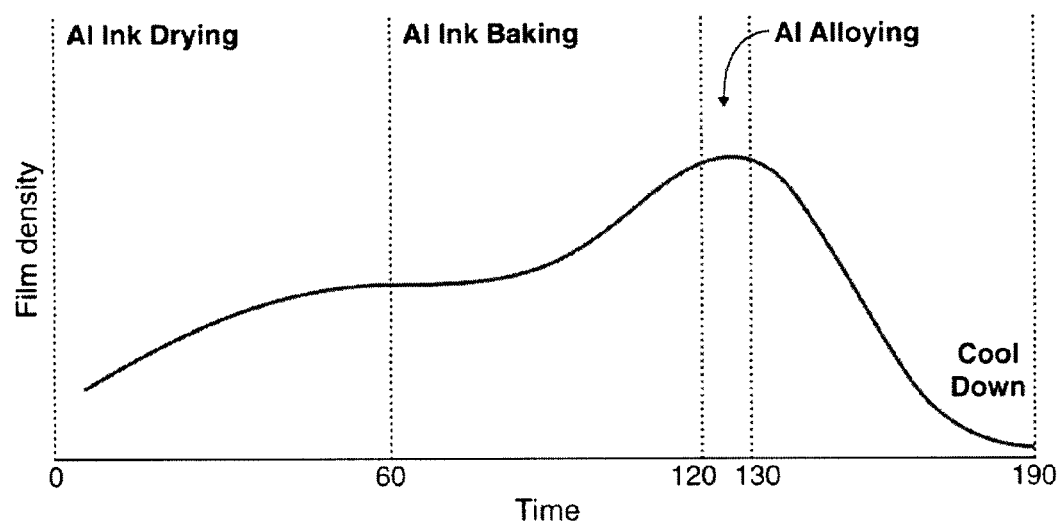
FIG. 8 is a graphic representation of a representative flux profile.

FIG. 8 is a graphic representation of a typical flux profile desired for an aluminum ink firing process. This process is useful for front contact formation in the preparation of a silicon solar cell. For the purposes of this prophetic example, it will be assumed that a throughput of 900 wafers per hour through an optical cavity furnace 10 as described above is desired. It will also be assumed that the optical cavity furnace 10 has been built with the width suitable for transporting and processing 9 wafers per row.

The desired throughput of 900 wafers per hour in conjunction with the width of the furnace requires 100 rows of wafers to be processed in one hour (3,600 seconds). Therefore, the feed rate of each row of wafers is one row fed into (or removed from) the oven per 36 seconds. A typical solar cell wafer is square with approximately 5 inch sides. Therefore, an initial belt speed of about 0.14 inches per second is necessary to achieve the desired feed rate. The total process time for the aluminum ink firing process must be considered to determine the length of the furnace necessary for this prophetic example. The total process time is approximately 60 seconds to dry the aluminum ink, 60 seconds for baking the ink, 10 seconds to alloy the aluminum, and 60 seconds to cool down. Thus, the total process time for this process is about 3 minutes at 0.14 inches per second. Accordingly, a suitable furnace length would be about 34 inches. As shown in FIG. 4, the total flux desired for each of the drying, baking, alloying and cool-down steps described above, is variable and different between steps. This variation in flux for each step may be accomplished as described above by controlling the location of and power applied to appropriate optical energy sources as the wafers are transported through the furnace. Alternatively, the rate of transport could be controlled while maintaining or independently controlling the local flux. Although the aluminum ink firing process does not require the application of process gases, process gases could be applied and withdrawn through inlets 26 and outlets 28 as described above.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. An optical cavity furnace comprising:
multiple optical energy sources;
one or more reflectors comprising a diffusely reflective surface associated with the optical energy sources;
one or more walls comprising a diffusely reflective surface associated with the optical energy sources wherein the walls and reflectors define an optical cavity and the optical energy sources are associated with the optical cavity;
a semiconductor wafer transport system for transporting a semiconductor wafer through the optical cavity;
a transport rate controller operatively associated with the semiconductor wafer transport system providing for the transportation of the semiconductor wafer through the optical cavity at a variable rate; and
a power input controller providing for the independent control of input power to more than one but less than all of the multiple optical energy sources, wherein the power input controller and the transport rate controller provide for control of a flux presented at a surface of the wafer which the flux is controlled to vary over time.

2. The optical cavity furnace of claim 1 further comprising optical energy sources positioned in association with more than one of a top, bottom and side walls of the optical cavity furnace.

3. The optical cavity furnace of claim 1 wherein at least one of the optical energy sources is located nearer to the semiconductor wafer transport system than another of the optical energy sources to achieve a selected flux density over a selected location on a wafer surface.

4. The optical cavity furnace of claim 1 further comprising a transmissive muffle located within the optical cavity between the semiconductor wafer transport system and the diffusely reflective surfaces of the reflectors and the diffusely reflective surfaces of the walls.

5. The optical cavity furnace of claim 1 wherein the semiconductor wafer transport system comprises a conveyor belt.

6. The optical cavity furnace of claim 1 further comprising a flux controller operatively associated with multiple optical energy sources to control the power input to selected optical energy sources to achieve a select flux distribution within the optical cavity.

7. The optical cavity furnace of claim 1 further comprising one or more process substance inlets into the optical cavity and one or more process substance outlets from the optical cavity.

8. The optical cavity furnace of claim 7 further comprising one or more process substance outlets positioned below a process plane defined by the semiconductor wafer transport system.

9. The optical cavity furnace of claim 7 further comprising a process substance controller operatively associated with one or more process substance inlets or process substance outlets.

10. The optical cavity furnace of claim 1 wherein one or more optical energy sources comprise a non-planar aperture.

11. An optical cavity furnace comprising:
means for generating optical energy comprising multiple optical energy sources;
means for diffusely reflecting the optical energy in an optical cavity;
means for transporting a semiconductor wafer through the optical cavity;
means for controlling a variable transportation rate of the semiconductor wafer through the optical cavity; and
means for independently controlling the power input to more than one but less than all of the multiple optical energy sources, wherein the means for controlling the power input and the means for controlling the variable transportation rate provide for the controlled variation of the flux presented at a surface of the wafer over time.

12. The optical cavity furnace of claim 11 wherein the means for generating optical energy comprises multiple energy sources and at least one of the optical energy sources is located nearer to the means for transporting a semiconductor wafer than another of the optical energy sources to achieve a selected flux density over a selected location on a wafer surface.

13. The optical cavity furnace of claim 11 further comprising means for introducing a process substance into the optical cavity and withdrawing a process substance from the optical cavity.

14. The optical cavity furnace of claim 13 further comprising means for controlling the application of process substances during the transportation of a semiconductor wafer through the optical cavity.

* * * * *